(12) United States Patent
Hsu et al.

(10) Patent No.: US 8,531,885 B2
(45) Date of Patent: Sep. 10, 2013

(54) NAND-BASED 2T2B NOR FLASH ARRAY WITH A DIODE CONNECTION TO CELL'S SOURCE NODE FOR SIZE REDUCTION USING THE LEAST NUMBER OF METAL LAYERS

(75) Inventors: Fu-Chang Hsu, San Jose, CA (US); Peter Wung Lee, Saratoga, CA (US)

(73) Assignee: Aplus Flash Technology, Inc., San Jose, CA (US)

( * ) Notice: Subject to any disclaimer, the term of this patent is extended or adjusted under 35 U.S.C. 154(b) by 194 days.

(21) Appl. No.: 13/116,002

(22) Filed: May 26, 2011

(65) Prior Publication Data

US 2011/0292738 A1    Dec. 1, 2011

Related U.S. Application Data

(60) Provisional application No. 61/396,553, filed on May 28, 2010.

(51) Int. Cl.
*G11C 11/34* (2006.01)
(52) U.S. Cl.
USPC ........................................... 365/185.17

(58) Field of Classification Search
USPC ........................................... 365/185.17
See application file for complete search history.

(56) References Cited

U.S. PATENT DOCUMENTS

| | | | | |
|---|---|---|---|---|
| 5,400,276 | A | * | 3/1995 | Takeguchi ................ 365/185.12 |
| 6,144,584 | A | * | 11/2000 | Kunori et al. ............ 365/185.18 |
| 6,212,102 | B1 | | 4/2001 | Georgakos et al. |
| 6,307,781 | B1 | | 10/2001 | Shum |
| 6,628,544 | B2 | | 9/2003 | Shum et al. |
| 6,980,472 | B2 | | 12/2005 | Ditewig et al. |

\* cited by examiner

*Primary Examiner* — Anthan Tran

(57) ABSTRACT

A NAND-based NOR flash memory array has a matrix of NAND-based NOR flash cells arranged in rows and columns. Every two adjacent NAND-based NOR flash cells in a column share a common source node which is connected to a common source line through a diode. The source line may be made of a metal layer and is in contact directly with the source node or through an ohmic contact to form a Schottky barrier diode. The source line may also be made of a polysilicon or metal layer and connected to the source node through a pillar-structured polysilicon diode and a conduction layer. The diode may also be formed in the source node by enclosing a P/N+ junction diode in a heavily N+ doped region of the source node.

24 Claims, 19 Drawing Sheets

A-A'

NAND-BASED 2T2B NOR FLASH ARRAY WITH A DIODE CONNECTION TO CELL'S SOURCE NODE FOR SIZE REDUCTION USING THE LEAST NUMBER OF METAL LAYERS

CROSS-REFERENCE TO RELATED APPLICATIONS

This application claims priority under 35 U.S.C. §119 to U.S. Provisional Patent Application Ser. No. 61/396,553, filed on May 28, 2010, assigned to the same assignee as the present invention, and incorporated herein by reference in its entirety.

BACKGROUND OF THE INVENTION

1. Field of the Invention

The present invention relates generally to the cell array architecture of nonvolatile memory devices, and more particularly to the cell array architecture of nonvolatile NAND-based NOR flash memory devices.

2. Description of Related Art

Nonvolatile memory is well known in the art. The different types of nonvolatile memory include read-only-memory (ROM), electrically programmable read only Memory (EPROM), electrically erasable programmable read only memory (EEPROM), NOR flash memory, and NAND flash memory. In current applications such as personal digital assistants, cellular telephones, notebook and laptop computers, voice recorders, global positioning systems, etc., the flash memory has become one of the more popular types of nonvolatile memory. Flash memory has the combined advantages of high density, small silicon area, low cost and can be repeatedly programmed and erased with a single low-voltage power supply voltage source.

The flash memory structures known in the art employ a charge storage mechanism and a charge trapping mechanism. In the charge storage regime, as with a floating gate nonvolatile memory, the charge representing digital data is stored on a floating gate of the device. The stored charge modifies the threshold voltage of the floating gate memory cell to determine the digital data stored. In a charge trapping regime, as in a silicon-oxide-nitride-oxide-silicon (SONOS) or metal-oxide-nitride-oxide-silicon (MONOS) type cell, the charge is trapped in a charge trapping layer between two insulating layers. The material such as silicon nitride ($SiN_x$) in the charge trapping layer in the SONOS/MONOS devices has a relatively high dielectric constant (k).

Both N-channel and P-channel flash memory cells could be employed to form the memory array. Hereafter, the N-channel flash memory cell is used as an example for description. In general, the unit size of a NAND flash memory cell is relatively smaller than the one of a NOR flash memory cell. In the conventional one transistor (1T) NOR flash memory, it uses channel hot electron (CHE) program scheme and Fowler-Nordheim tunneling erase scheme. Due to the requirement of high enough lateral electric field and electron-hole pairs generated at N+/P+ junction with the biased voltage, the channel length can not be formed by the smallest feature size in the most advanced process because of the punch-through concern. In other words, the scalability becomes worse when the advanced technology has a small geometry such as 130 nm or below.

As for the conventional NAND flash memory N-Transistor string, it can take advantage of the smallest feature size in the most advanced process. However, the requirement of two source line (SL) and bit line (BL) select gate transistors along the NAND string to isolate from other NAND string requires certain extra percentage of overhead in the size of the whole memory array. Due to the punch-through concern on those two SL and BL select gate transistors, their channel length can not be made with the smallest feature size in the most advanced process either. In other words, the smallest feature size can only be applied to the memory cell with the cost of more percentage of overhead for the SL and BL select gate transistors.

In the NOR flash memory, there is another type called 2T NOR flash memory that is formed by one access transistor and one memory cell. No over-erase issue and less hot carrier injection (HCI) are the advantages of the 2T NOR flash memory because of the access transistor. However, the problem of punch-through effect is just moved from the memory cell to the access transistor.

U.S. Pat. No. 6,212,102 discloses a 2T NOR flash cell in which a high voltage is required across the drain and source nodes of the flash cell during FN-edge programming and a longer channel length is also required to prevent the punch-through effect. This causes a physical limitation on how small the cell can be made and in turn limits the use of the cell in ultra high integrated levels of the flash memory below 0.18 μm technology. Furthermore, the negative FN-edge programming causes device oxide degradation because the electron-hole pairs at the biased drain/TPW (triple P-Well) junction are accelerated by the voltage difference between the drain and source nodes. The more holes are trapped in the tunneling oxide, the less P/E endurance cycles will be attained.

U.S. Pat. Nos. 6,307,781 and 6,628,544 disclose improvements over U.S. Pat. No. 6,212,102 with uniform channel erase and channel program operations. However, by connecting the common source together in the array, the gate of the access device has to be applied with the most negative voltage, e.g., −3V, to turn off the path to different bit lines through the common source line. Due to this biased condition during the program operation, the program inhibit voltage, i.e., 3V-4V is supposedly isolated by the access device. However, the drain induced leakage current may occur if the channel length is scaled down. Therefore, the flash cell still faces the scaling issue and can only be manufactured with a large memory cell size.

U.S. Pat. No. 6,980,472 presents another flash memory in which both source side injection programming and FN channel programming schemes are disclosed. In the memory array, the same scaling issue exists. For the channel programming, it is similar to the one disclosed in U.S. Pat. Nos. 6,307,781 and 6,628,544. The short channel length in the access device cannot stop the drain induced leakage current to the common source line while the program inhibit voltage is applied across the drain region and the source region. In a same manner, for the source side injection programming scheme, the access device needs a longer channel length to prevent the punch-through effect. In addition, compared to the FN channel programming, the flash memory needs more program current because of the hot-electron generation.

FIG. 1 is a schematic diagram of a 2T string NAND-based NOR flash memory array 10 with separate bit lines and source lines to overcome the above mentioned drawbacks. In the array, the source lines SL0-SL1 are structured as parallel to the bit lines BL0-BL1 and orthogonal to the word lines WL0-WL3. With this structure, the program voltage and program inhibit voltage can be applied to each bit line or source line respectively while performing a program operation. Unlike the traditional array with a common source line, there is no voltage difference between the drain node and the source node of a flash cell in the memory array of FIG. 1 during the program operation. As a result, no punch through problem needs to be taken into consideration and memory size scalability can be attained. In the advanced process such as 90 nm and beyond, the advantage of the small memory cell size in the 2T string NAND-based NOR flash memory is evident.

FIG. 2A is a layout diagram 20 of the 2T string NAND-based NOR flash array shown in FIG. 1. In the layout, both the source lines SL0-SL1 and the bit lines BL0-BL1 are formed on the same metal layer. By using M1 metal layer as the bit lines and source lines, the effective memory cell size is larger because of the M1 metal layer spacing. The memory cell size can be reduced by using more metal layers to implement the bit lines and source lines.

FIG. 2B is another layout diagram 25 of the 2T string NAND-based NOR flash array shown in FIG. 1. In the layout, the source lines SL0-SL1 and the bit lines BL0-BL1 are formed by three different metal layers. By using the connection of M1 metal layer, M2 metal layer and M3 metal layer to place the bit lines and the source lines, the effective memory cell size is reduced because of the utilization of multiple metal layers to save the area.

The needs of an improved array architecture for NOR flash memories to be manufactured with the smallest feature size for cell size reduction in the advanced technology without concerns of the drain induced leakage current and punch-through issue are obvious from the above discussion.

SUMMARY OF THE INVENTION

The present invention has been made to overcome the above-mentioned drawbacks of the conventional NOR flash memories. A novel memory array architecture in which a diode connection to the source node of each cell is provided for the nonvolatile two transistor two bit (2T2b) NAND-based fast-random-read NOR flash cell for code storage. Different operations according to the new array architecture are also provided. According to the invention, only one metal layer is required for the preferred 2T2b NAND-based NOR cell array. Furthermore, because the NOR flash cell uses the same technology as the cells of NAND memories, a unified combo NAND and NOR flash design can be integrated into one single chip for both code and data storages in the growing mobile handset applications.

Accordingly, an object of the present invention is to provide a novel cell structure with a diode connected between the source line and the source node of the nonvolatile memory cell which can be 1T (one transistor) NOR, 2T string (two transistor string) NAND-based NOR or NT string (N transistor string) NAND flash structure.

Another object of the present invention is to provide a floating gate and SONOS type flash memory cell having a smallest feature size in the advanced technology. Device scaling can be achieved without any crucial limitation because of the reversed diode connection along the source line.

A further object of the present invention is to use FN channel program and FN channel erase schemes for the floating gate and SONOS type flash memory. A zero voltage difference is provided between the drain node and the source node of the 1T, 2T or NT-string flash cell in erase and program operations. A highly scalable symmetrical memory cell can thus be attained.

It is also an object of the present invention to provide preferred voltages for selected word lines, bit lines, source lines and TPW so that the uniform FN channel program and FN channel erase operations can incur less tunneling oxide degradation to achieve high P/E endurance cycles.

It is another object of the present invention to provide a preferred voltage for the unselected word lines for a channel program operation so that the disturbance of the threshold voltage (Vt) of the unselected cells can be eliminated or substantially reduced.

Yet another object of the present invention is to apply an appropriate voltage to the source line while the flash cell is read. The states of the erase and program operations can be distinguished by the conduction status of the selected memory cell. The forward current of the diode can be detected once the memory cell stays at a conduction mode.

It is yet a further object of the invention to provide a Schottky diode between the source line and the source node of the memory cell, wherein the source line is made of a metal layer M0 and is directly in contact with the source node of the memory cell. The source node of the memory cell is lightly doped with an N– region to form the Schottky barrier diode.

Another object of the invention is to provide a Schottky diode between the source line and the source node of the memory cell, wherein the source line is made of a metal layer M1 and is connected to the source node of the memory cell through a contact. The source node of the memory cell is lightly doped with an N– region to form the Schottky barrier diode.

Still an object of the invention is to provide a pillar-structured polysilicon diode between the source line and the source node of the memory cell. The source line is made of a metal layer M1 or a doped poly layer and is connected to the source node of the memory cell through the polysilicon diode and a contact. The source node of the memory cell is doped with the same concentration as the drain node of the memory cell.

A further object of the invention is to provide a P/N+ silicon diode between the source line and the source node of the memory cell. The source line is made of a metal layer M1 and is in connection with the source node of the memory cell through a contact. The doped P silicon is enclosed by the N+ region at the source node of the memory cell which is doped with the same concentration as the drain node.

It is a further object of the invention to provide a P/N+ silicon diode between the source line and source node of the memory cell. The source line is made of a metal layer M0 and is in contact with the P silicon. The doped P silicon is enclosed by the N+ region at the source node of the memory cell which is doped with the same concentration as the drain node.

BRIEF DESCRIPTION OF THE DRAWINGS

The present invention will be apparent to those skilled in the art by reading the following description, with reference to the attached drawings brief summarized below.

DETAILED DESCRIPTION OF THE INVENTION

Figure 1:
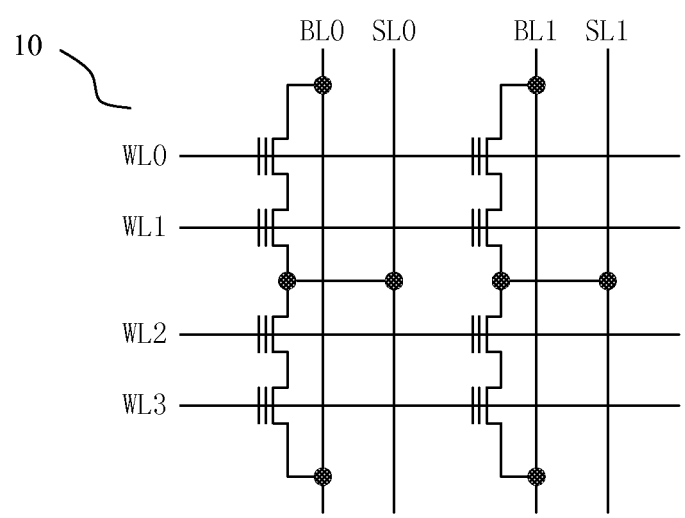
FIG. 1 shows a schematic diagram of a 2T string NAND-based NOR flash memory array with separate bit lines and source lines.
Figure 2A:
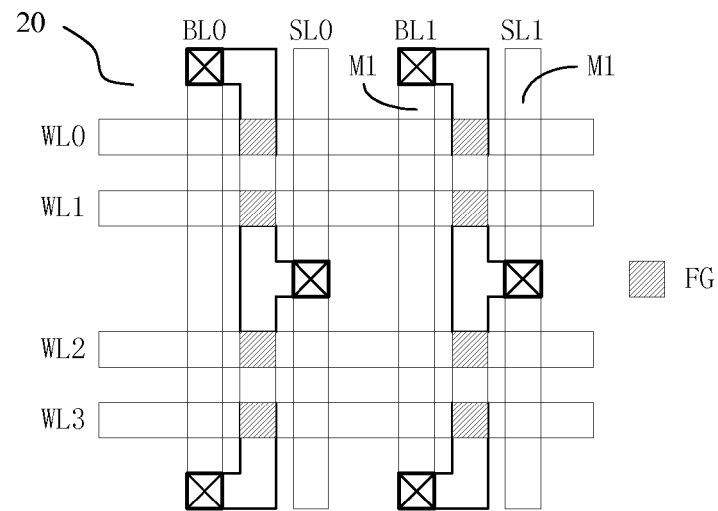
FIG. 2A shows a corresponding layout diagram of the 2T string NAND-based NOR flash memory array in FIG. 1 with separate bit lines and source lines made with M1 metal layer.
Figure 2B:
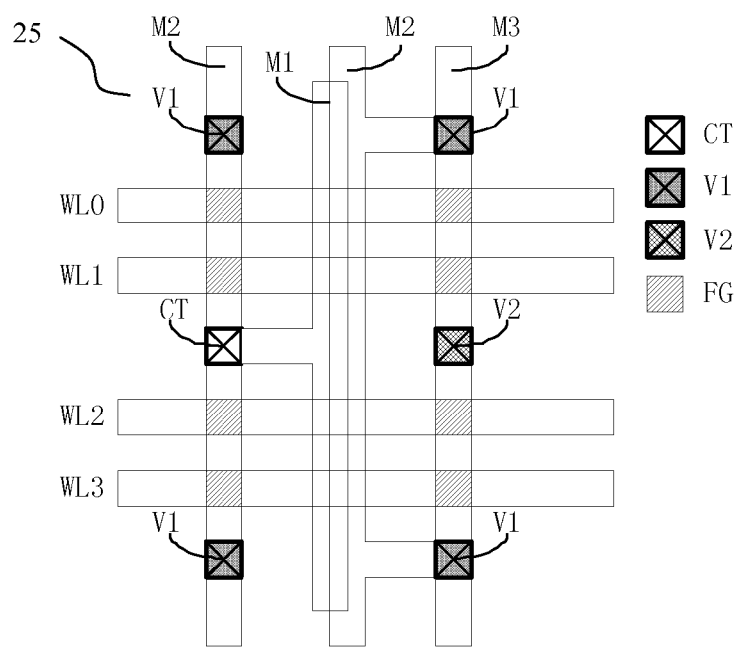
FIG. 2B shows a corresponding layout diagram of the 2T string NAND-based NOR flash array in FIG. 1 with separate bit lines and source lines made with multiple metal layers.
Figure 3A:
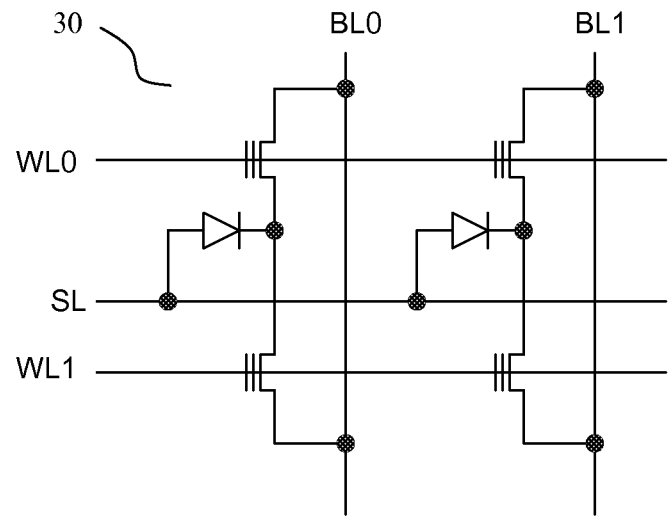
FIG. 3A shows a schematic diagram of a 1T NOR flash array by using a diode to connect the source of each individual memory cell to one common source line according to the present invention.

FIG. 3A is a schematic diagram 30 of a 1T NOR flash memory array of the present invention in which a diode is used to connect the source node of each individual memory cell to one common source line. The memory array is composed of bit lines BL0-BL1, word lines WL0-WL1 and one common source line SL. By connecting the source line at the positive end of the diode, the source node of each memory cell is connected to the negative end of the diode.

Figure 3B:
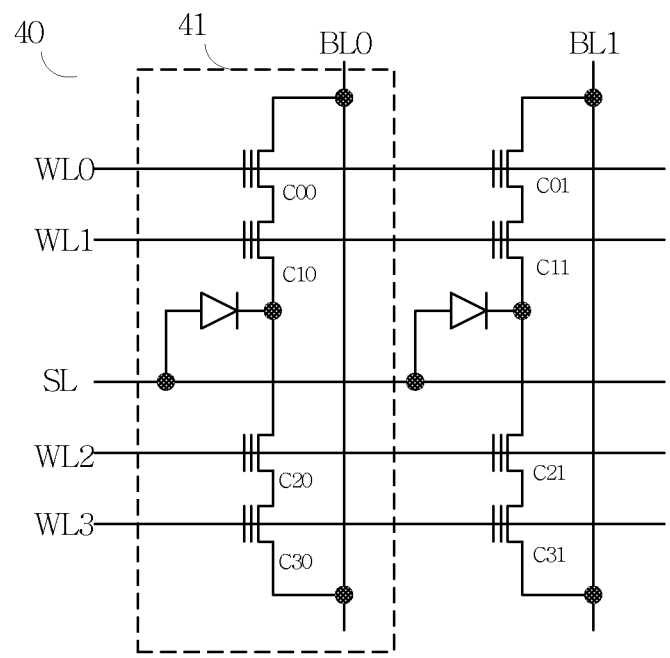
FIG. 3B shows a schematic diagram of a modified 2T string NAND-based NOR flash array by using a diode to connect the source of each individual memory cell to one common source line according to the present invention.

FIG. 3B is a schematic diagram 40 of a modified 2T string NAND-based NOR flash memory array of the present invention by using a diode to connect the source node of each individual memory cell to one common source line. This memory array is composed of bit lines BL0-BL1, word lines WL0-WL3 and one common source line SL. By connecting the source line at the positive end of the diode, the source node of each memory cell is connected to the negative end of the diode.

Figure 3C:
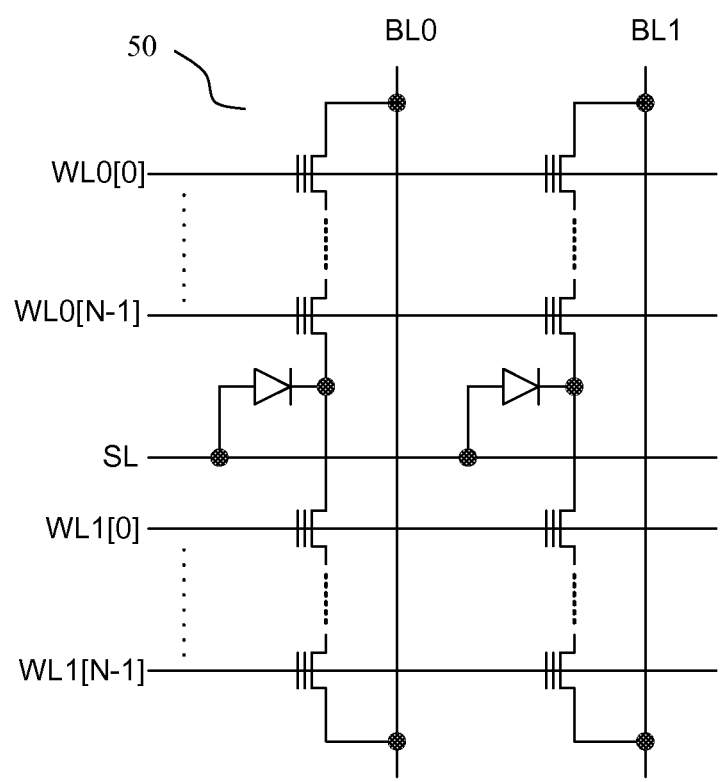
FIG. 3C shows a schematic diagram of a modified NT string NAND-based NOR flash array by using a diode to connect the source of each individual memory cell to one common source line according to the present invention.

FIG. 3C is a schematic diagram 50 of a modified NT string NAND flash memory array according to the present invention by using a diode to connect the source node of each individual memory cell to one common source line. This memory array is composed of bit lines BL0-BL1, word lines WL0[0]-WL0[N−1], WL1[0]-WL1[N−1] and one common source line SL. By connecting the source line at the positive end of the diode, the source node of each memory cell is connected to the negative end of the diode. Unlike the conventional NT string NAND flash cell, there is no bit line select gate and source line select gate connected to the drain node and the source node of the flash cell in the present invention.

Figure 4:
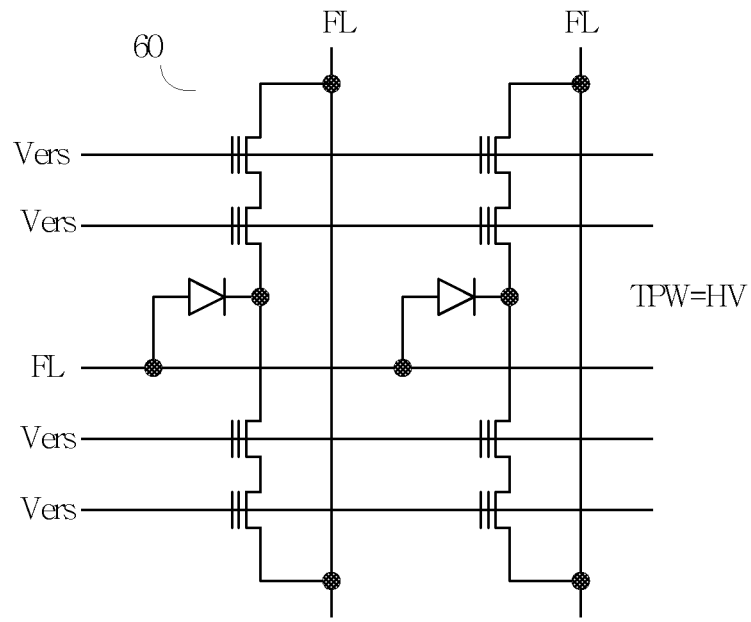
FIG. 4 shows the bias condition applied to the modified 2T string NAND-based NOR flash array for an erase operation according to the present invention.

FIG. 4 shows the bias condition 60 applied to the modified 2T string NAND-based NOR flash memory array of the present invention for an erase operation. The erase operation is accomplished by using the channel Fowler-Norheim tunneling scheme. During an erase operation, the selected word lines are coupled with Vers=0V in the illustrated diagram. For the P-type well (TPW), it is coupled to a high voltage (HV) level of approximately +20.0V. The common source line and the bit lines are set as floating (FL). After a predetermined time for erasure, the electrons in the memory cell along the selected word lines are expelled from the floating gate to TPW through the insulating gate oxide.

For the unselected word lines, they are set to floating. Once TPW is applied to approximately +20.0V, those unselected word lines are also coupled to approximately +20.0V too. No electrons are expelled out of the floating gate of the memory cells. As a result, the threshold voltage of the memory cells will be decreased. According to the present invention, the bias condition for the erase operation can also be accomplished by splitting the voltage applied on TPW and Vers. In other words, TPW can be applied with 10V and the selected word line voltage Vers can be applied with −10V. Similarly, the bias condition can also be achieved by applying the most negative voltage −20V to the selected WL and 0V to TPW.

During the erase operation of the present invention, there is no voltage difference between the source node and the drain node of the memory cell. Due to the forward biased condition between TPW and N+ junction of the drain node and source node of the memory cells, no punch-through effect may occur. As for the diode connected to the common source line, it is set with a reversed bias condition. The floating common source line can be coupled with a rational voltage from TPW. Therefore, no break down situation needs to be taken into consideration.

Figure 5:
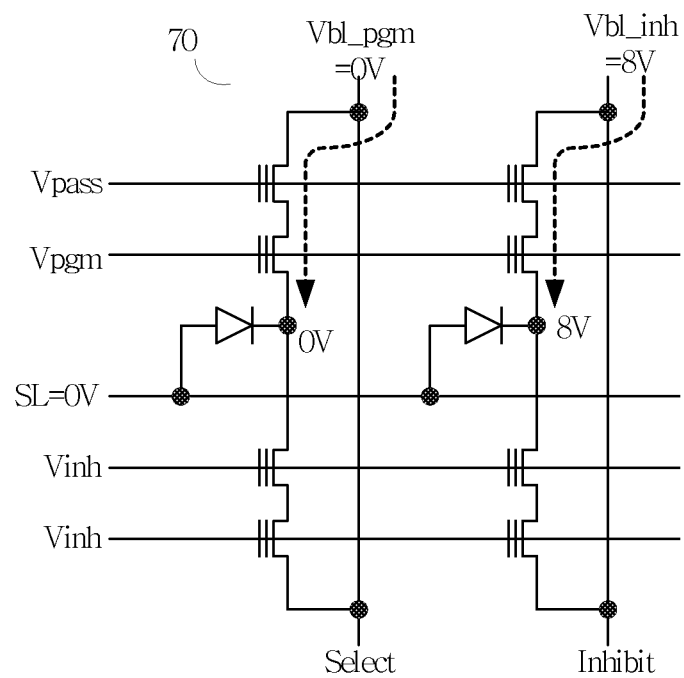
FIG. 5 shows the bias condition applied to the modified 2T string NAND-based NOR flash array for a program operation according to the present invention.

FIG. 5 shows the bias condition 70 applied to the modified 2T string NAND-based NOR flash memory array of the present invention for a program operation. The program operation is also accomplished by using the channel Fowler-Norheim tunneling scheme. During a program operation, Vpgm is applied to the selected word line and Vpass is applied to the adjacent word line as illustrated in the diagram. Vpgm is a step-wise pulse voltage from 15V to 20V and Vpass is about 10V. The unselected word lines are applied with Vinh which is approximately one half of the bit line inhibit voltage Vbl_inh. In other words, the bit line inhibit voltage Vbl_inh is set at about 8V-10V, and Vinh is about 4V-5V. In the illustrated diagram, bit line voltage Vbl_pgm is set to 0V for programming the selected memory cell. As for the selected but not to be programmed memory cell, the bit line voltage Vbl_inh is set to 8V-10V. Both the source line SL and the P-type well (TPW) are set to 0V.

After a predetermined time for programming, the electrons in the TPW along the selected word lines are injected to the floating gate through the insulating gate oxide because the high electric field has been established for the programmed memory cells. On the contrary, for the selected but non-programmed memory cells, the low electric field can not generate enough electrons to be injected to the floating gate through the insulating gate oxide. In a same manner, for most of the unselected memory cells, the lowest electric field established between the floating gate and TPW can not generate enough electrons to be injected to the floating gate through the insulating gate oxide either. As a result, the threshold voltage of the selected memory cell to be programmed according to the desired program pattern is increased. The threshold voltage of the memory cell selected but to be inhibited is not changed. The threshold voltages of all the unselected memory cells are not changed either.

In the program operation, there is no voltage difference between the source nodes and the drain nodes of the memory cells regardless of the program pattern applied to the bit lines. For the selected 2T string NAND-based NOR cell shown in the illustrated diagram, the inhibit voltage Vbl_inh on the bit line can be presented to the source node because of the high voltage Vpgm and Vpass on the word lines. Therefore, no voltage difference exists between the source node and the drain node of the memory cell. As for all the remaining unselected memory cells, the word line voltage Vinh is about 4-5V which is not high enough to turn on the memory cells. Therefore, the punch-through phenomena may occur as long as the channel length is featured as the smallest geometry size in the most advanced technology. The inhibit voltage on the bit lines will be presented to the source nodes of all the remaining unselected memory cells. However, because the common source line is applied with 0V and connected through a diode to the source node of each memory cell, the reversed bias condition always prevents the leakage current to the common source line from occurring and ensures the success of the program operation on the selected memory cells. In the conventional 2T NOR flash cell, a longer channel length has to be chosen to prevent the punch-through problem and the leakage current. In the present invention, the punch-through phenomena can be tolerated without any leakage current during the program operation.

Figure 6:
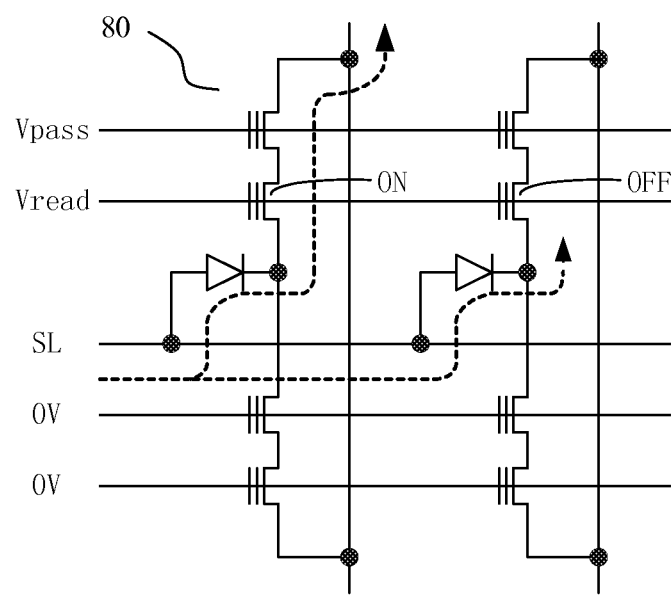
FIG. 6 shows the bias condition applied to the modified 2T string NAND-based NOR flash array for a read operation according to the present invention.

FIG. 6 shows the bias condition 80 applied to the modified 2T string NAND-based NOR flash memory array of the present invention for a read operation. In the read operation, the common source line is applied with a certain voltage, e.g., 1.5V. The selected word line of the modified 2T string NAND-based NOR flash memory cell is applied with Vread and the adjacent word line is applied with Vpass. Typically, Vread is a voltage higher than the highest threshold voltage of the erased cell by 1.5V~2V or VDD as long as it meets the previous criteria. Here, Vpass should be higher than the highest threshold voltage of the programmed cell by 2V. All the other unselected word lines and TPW are applied with 0V. Due to the forward biased diode connection between the common source line and the source node of the memory cell, the read current flows from the source node to the drain node through the memory cell which is in an erased state. On the contrary, there is no or less current flowing from the source node to the drain node through a memory cell in a programmed state.

Figure 7A:
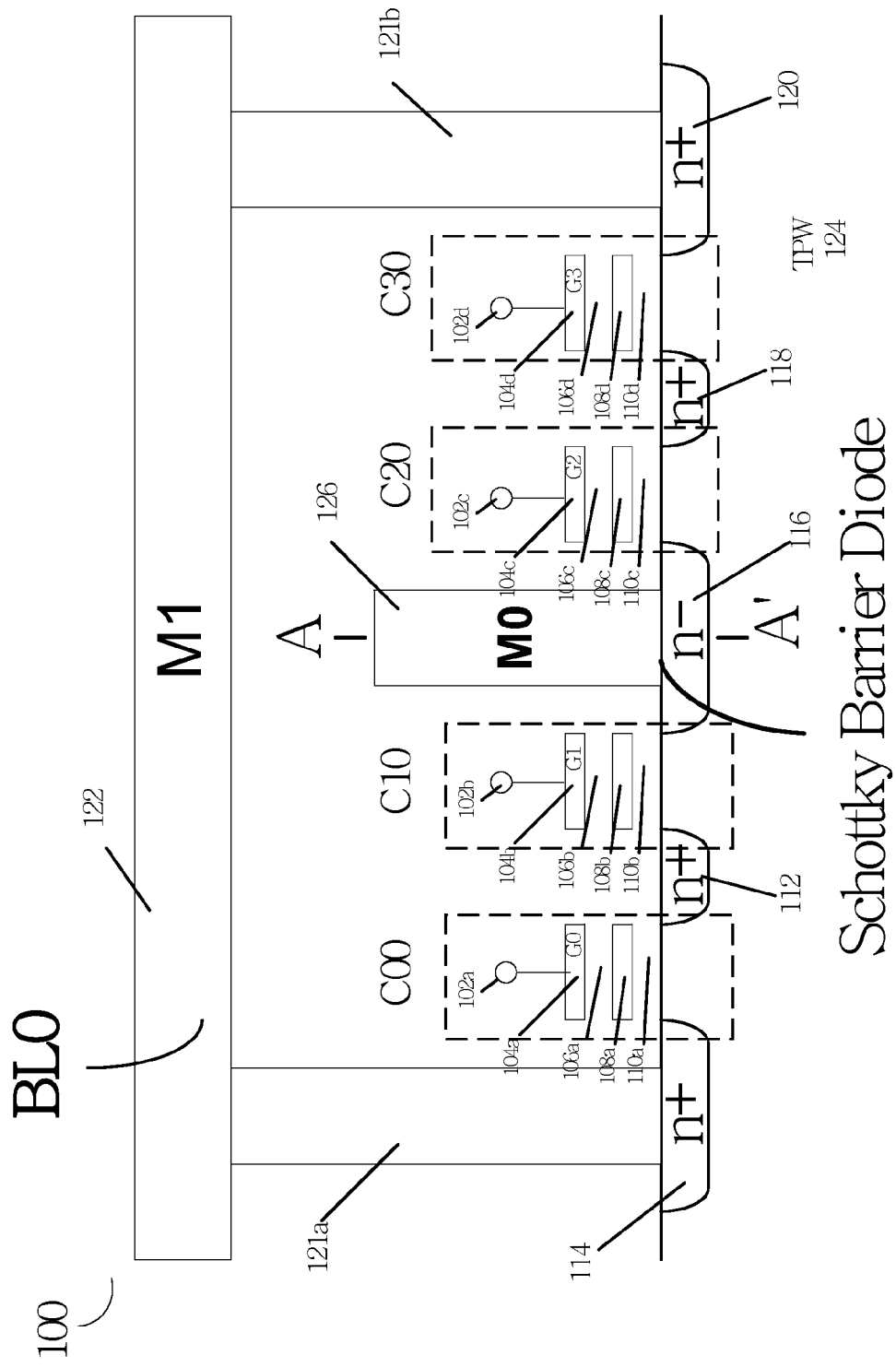
FIG. 7A is a cross sectional view of two pairs of the modified 2T string NAND-based NOR flash cells illustrated in FIG. 3B according to one embodiment of the present invention.

FIG. 7A is a cross sectional view 100 of two pairs of modified 2T string NAND-based NOR flash cells 41 as shown in FIG. 3B according to the present invention. The gates of transistors C00, C10, C20 and C30 are made of poly2 conduction layer. G0 104a, G1 104b, G2 104c, and G3 104d are the poly2-gates of the 2-poly storage transistors C00, C10, C20 and C30. As described above, all seven nodes BL0 122, 102a, 102b, 102c, 102d, SL 126 and TPW 124 of the two pairs of modified 2T string NAND-based NOR flash cells have to be coupled with appropriate bias conditions in the circuit for respective operations.

Underneath the poly2-gates 104a, 104b, 104c and 104d, those NMOS device transistors have ONO as the gate dielectric shown as 106a, 106b, 106c and 106d, poly1 floating gates 108a, 108b, 108c and 108d and tunneling oxides 110a, 110b, 110c and 110d. The electrons injected from TPW 124 can be retained in the floating gates 108a, 108b, 108c and 108d while the flash cell is programmed. On the contrary, the stored electrons in the floating gates 108a, 108b, 108c and 108d are pulled out toward TPW 124 while an erase operation is performed. SL 126 is made of M0 metal layer and is directly connected to lightly doped N− region 116 to form the Schottky barrier diode. The heavily doped N+ drain regions 114, 120 and drain/source regions 112, 118 of the two pairs of modified 2T string NAND-based NOR flash cells are implanted with phosphorus on TPW 124. BL0 122 is made of M1 metal layer and connected to the drain regions 214 and 220 through the ohmic contacts 121a and 121b.

Figure 7B:
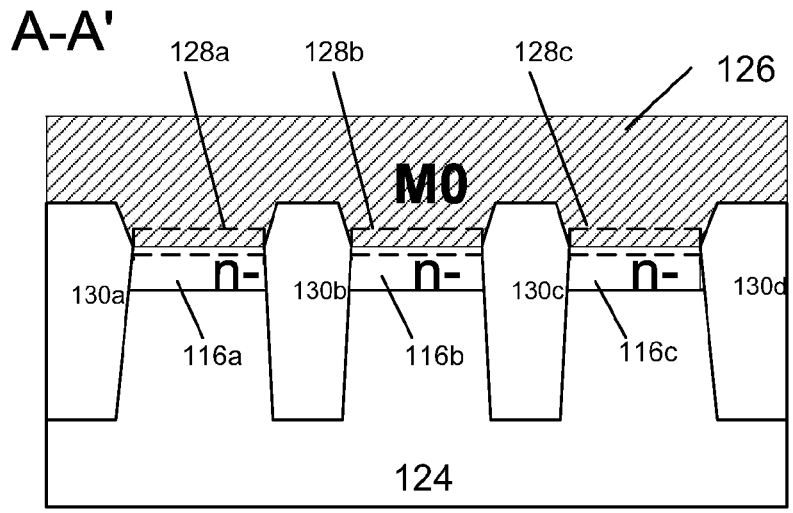
FIG. 7B is a cross sectional view of the modified 2T string NAND-based NOR flash cells of FIG. 7A taken along section A-A' thereof.

FIG. 7B is a cross sectional view of the modified 2T string NAND-based NOR flash cell in FIG. 7A taken at section A-A' thereof. There are three Schottky diodes 128a, 128b and 128c formed between M0 metal layer 126 and N− source regions 116a, 116b and 116c on TPW 124. These diodes are isolated by the insulators 130a, 130b, 130c and 130d respectively.

Figure 7C:
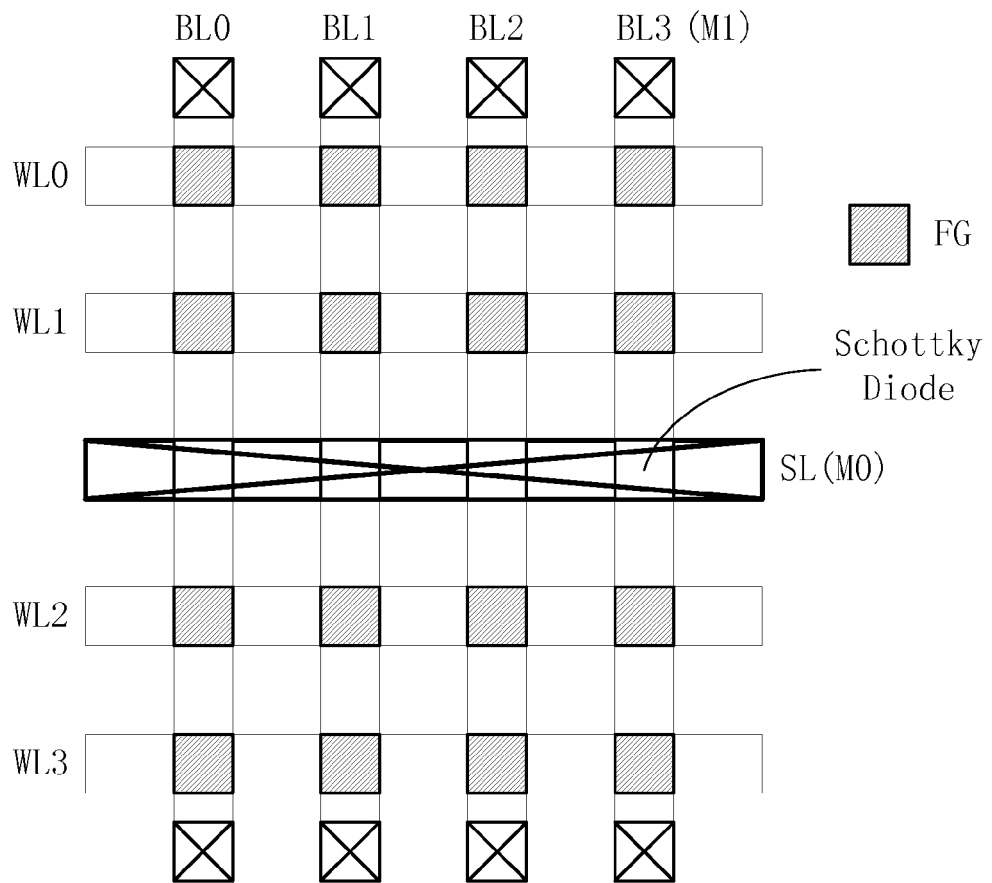
FIG. 7C is a layout diagram of the modified 2T string NAND-based NOR flash cells of FIG. 7A with four word lines, four bit lines, one common source line and four individual Schottky diodes.

FIG. 7C is a layout diagram of the modified 2T string NAND-based NOR flash cell array corresponding to FIG. 7B with four word lines, four bit lines, one common source line and four individual Schottky diodes according to the present invention. The four word lines WL0, WL1, WL2 and WL3 are made of poly2. The four bit lines BL0, BL1, BL2 and BL3 are formed in M1 metal layer. The overlapped area between word lines and bit lines is the flash memory cell, where the floating gate (FG) is used to store the charge. One common SL is made of M0 metal layer and is in parallel with the word lines. Four individual Schottky diodes are formed at the overlapped area between the four bit lines and one common source line SL.

Figure 8:
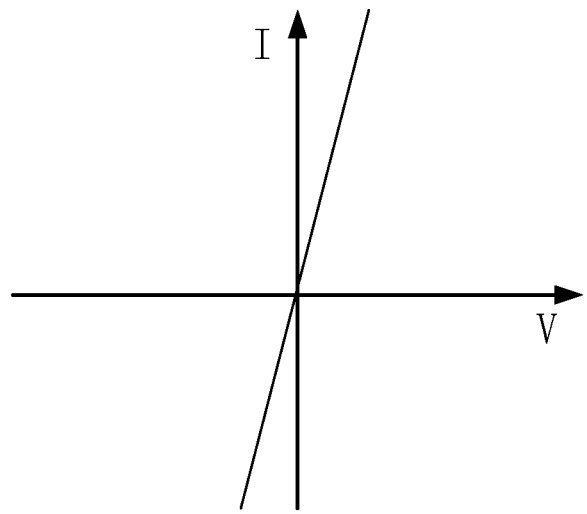
FIG. 8 is an I-V curve of a normal ohmic contact.

FIG. 8 is an I-V curve of a normal ohmic contact. According to the characteristics of the semiconductor, the current-voltage (I-V) curve is linear and symmetric on the region of a semiconductor device. As shown FIG. 7C and FIG. 10C, there are eight ohmic contacts located at overlapped area between the four bit lines and the drain regions of the memory cells.

Figure 9:
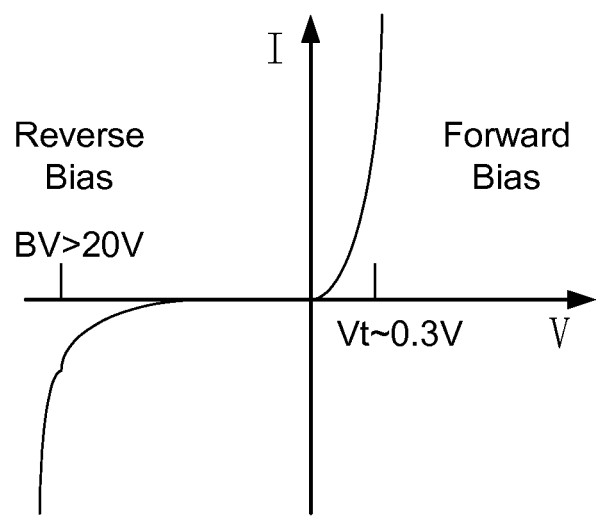
FIG. 9 is an I-V curve of a Schottky barrier contact.

FIG. 9 is an I-V curve of a Schottky barrier contact. As can be seen, the current-voltage (I-V) curve is nonlinear and asymmetric on the region of a semiconductor device. A Schottky barrier is a potential barrier at the junction between metal and semiconductor. As shown in the I-V curve, it provides the capability to rectify the current and is suitable as a diode. Compared to a P-N junction diode, it has a lower junction voltage and a decreased depletion width in the metal. Proper control for the concentration of the dopants in the semiconductor, the metal's work function, the gap of the intrinsic semiconductor and other manufacturing factors can achieve the rectifying I-V curve as shown in FIG. 9.

Figure 10A:
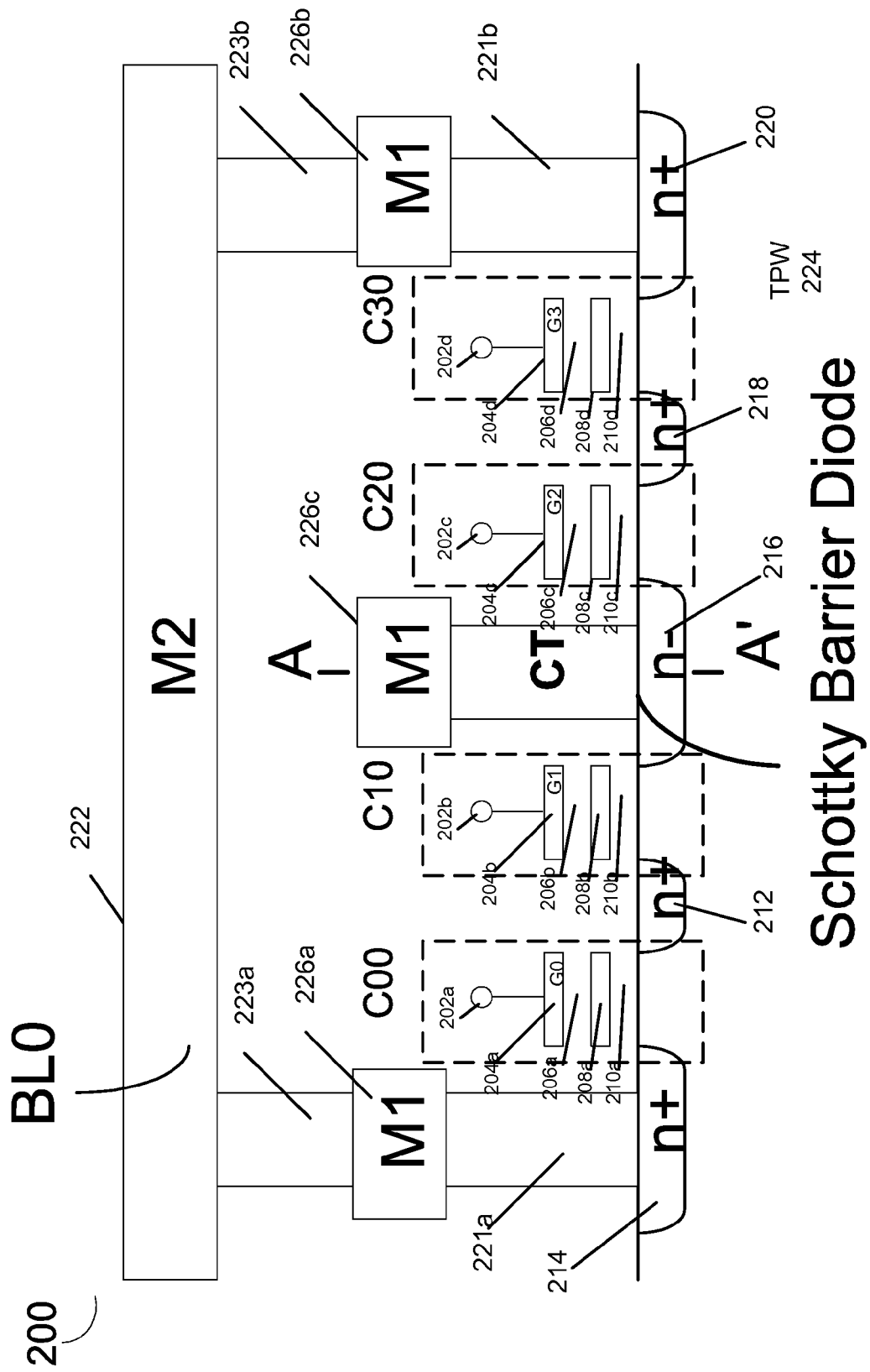
FIG. 10A is a cross sectional view of two pairs of the modified 2T string NAND-based NOR flash cells illustrated in FIG. 3B according to another embodiment of the present invention.

FIG. 10A is a cross sectional view 200 of two pairs of modified 2T string NAND-based NOR flash cells 41 as shown in FIG. 3B according to another embodiment of the present invention. The gates of transistors C00, C10, C20 and C30 are made of poly2 conduction layer. G0 204a, G1 204b, G2 204c, and G3 204d are the poly2-gates of the 2-poly storage transistors C00, C10, C20 and C30. As described above, all seven nodes BL0 222, 202a, 202b, 202c, 202d, SL 226c and TPW 224 of the two pairs of modified 2T string NAND-based NOR flash cells have to be coupled with appropriate bias conditions in the circuit for respective operations.

Underneath the poly2-gates 204a, 204b, 204c and 204d, those NMOS device transistors have ONO as the gate dielectric shown as 206a, 206b, 206c and 206d, poly1 floating gates 208a, 208b, 208c and 208d and tunneling oxides 210a, 210b, 210c and 210d. The electrons injected from TPW 224 can be retained in the floating gates 208a, 208b, 208c and 208d while the flash cell is programmed. On the contrary, the stored electrons in the floating gates 208a, 208b, 208c and 208d are pulled out toward TPW 224 while an erase operation is performed. SL 226c is made of M1 metal layer and is connected to lightly doped N− region 216 through contact CT to form the Schottky diode. The heavily doped N+ drain regions 214, 220 and drain/source regions 212, 218 of the two pairs of modified 2T string NAND-based NOR flash cells are implanted with phosphorus on TPW 224. BL0 222 is made of M2 metal layer and connected to the drain regions 214 and 220 through the ohmic contacts 221a and 221b, M1 metal 226a, 226b, and vias 223a and 223b.

Figure 10B:
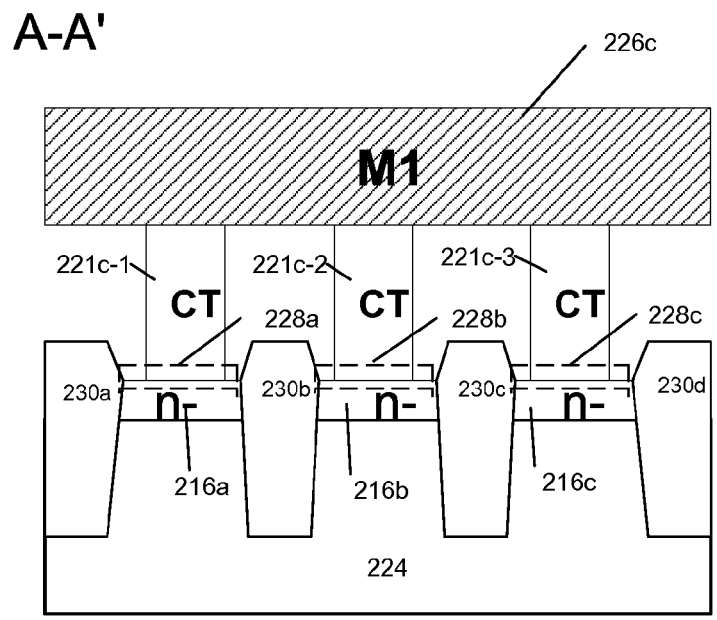
FIG. 10B is a cross sectional view of the modified 2T string NAND-based NOR flash cells of FIG. 10A taken along section A-A' thereof.

FIG. 10B is a cross sectional view of the modified 2T string NAND-based NOR flash cell in FIG. 10A taken at section A-A' thereof. There are three Schottky diodes 228a, 228b and 228c formed between M1 metal layer 226c and N− source regions 216a, 216b and 216c through contacts 221c-1, 221c-2, 221c-3 on TPW 224. These diodes are isolated by the insulators 230a, 230b, 230c and 230d respectively.

Figure 10C:
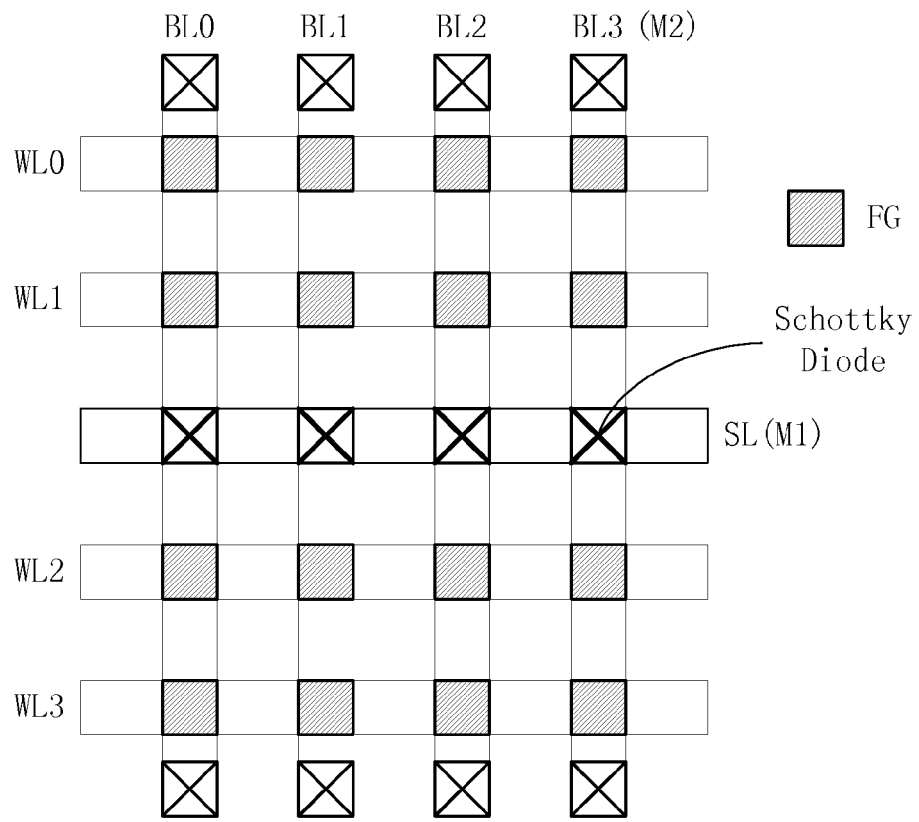
FIG. 10C is a layout diagram of the modified 2T string NAND-based NOR flash cells of FIG. 10A with four word lines, four bit lines, one common source lines and four individual Schottky diodes.

FIG. 10C is a layout diagram of the modified 2T string NAND-based NOR flash cell array corresponding to FIG. 10B with four word lines, four bit lines, one common source lines and four individual Schottky diodes according to the present invention. The four word lines WL0, WL1, WL2 and WL3 and made of poly2. The four bit lines BL0, BL1, BL2 and BL3 are formed in M2 metal layer. The overlapped area between word lines and bit lines is the flash memory cell, where the floating gate (FG) is used to store the charge. One common SL is made of M1 metal layer and is in parallel with the word lines. Four individual Schottky diodes are formed at the overlapped area between four bit lines and one common source line SL.

Figure 11A:
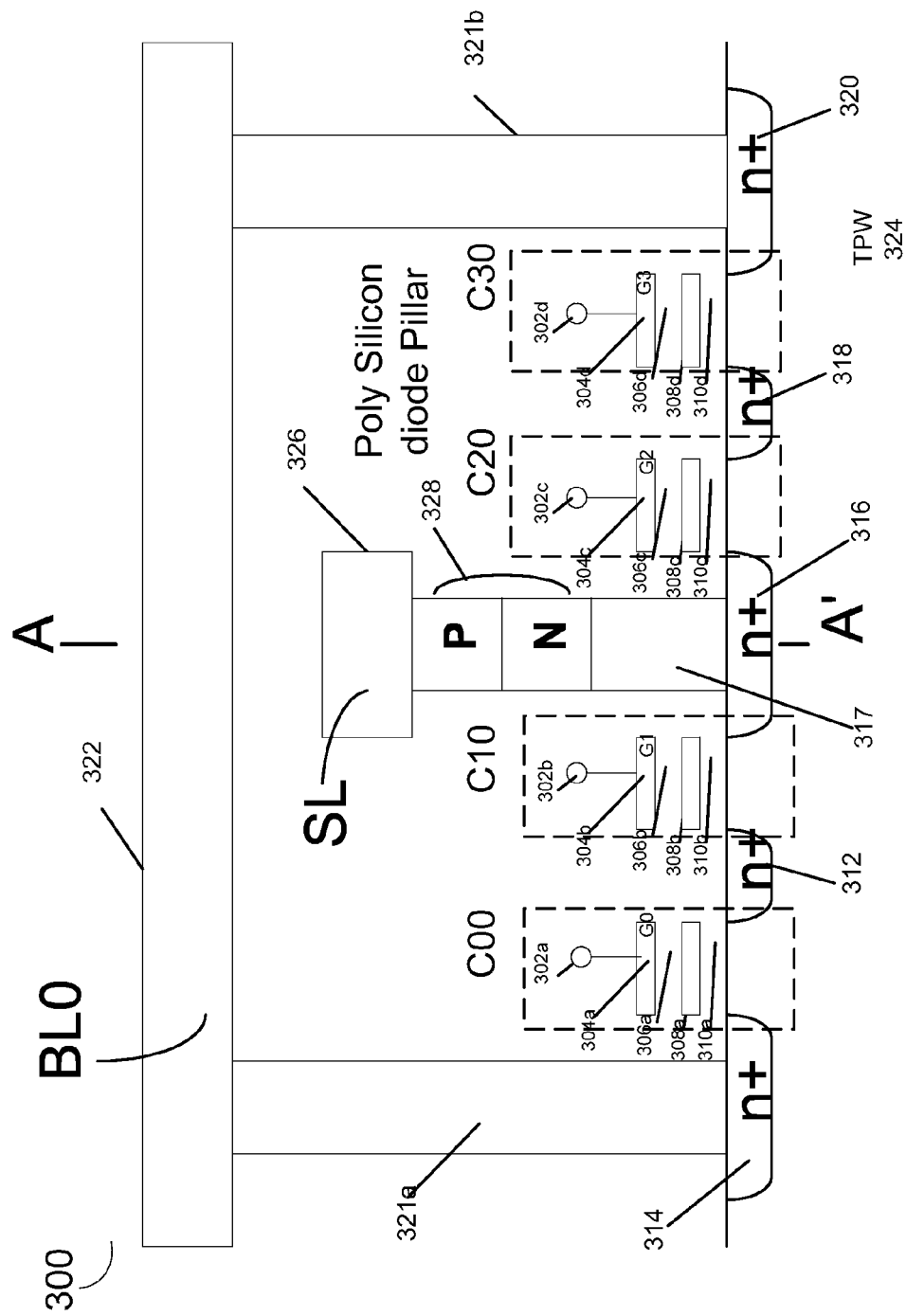
FIG. 11A is a cross sectional view of two pairs of the modified 2T string NAND-based NOR flash cells illustrated in FIG. 3B according to an alternative embodiment of the present invention.

FIG. 11A is a cross sectional view 300 of two pairs of modified 2T string NAND-based NOR flash cells 41 as shown in FIG. 3B according to an alternative embodiment of the present invention. The gates of transistors C00, C10, C20 and C30 are made of poly2 conduction layer. G0 304a, G1 304b, G2 304c, and G3 304d are the poly2-gates of the 2-poly storage transistors C00, C10, C20 and C30. As described above, all seven nodes BL0 322, 302a, 302b, 302c, 302d, SL 326 and TPW 324 of the two pairs of modified 2T string NAND-based NOR flash cells have to be coupled with appropriate bias conditions in the circuit for respective operations.

Underneath the poly2-gates 304a, 304b, 304c and 304d, those NMOS device transistors have ONO as the gate dielectric shown as 306a, 306b, 306c and 306d, poly1 floating gates 308a, 308b, 308c and 308d and tunneling oxides 310a, 310b, 310c and 310d. The electrons injected from TPW 324 can be retained in the floating gates 308a, 308b, 308c and 308d while the flash cell is programmed. On the contrary, the stored electrons in the floating gates 308a, 308b, 308c and 308d are pulled out toward TPW 324 while an erase operation is performed. SL 326 is made of polysilicon or a metal layer and is connected to N+ junction 316 through the pillar-structured polysilicon diode 328 and one conductive layer 317. The heavily doped N+ drain regions 314, 320 and drain/source regions 312, 318 of the two pairs of modified 2T string NAND-based NOR flash cells are implanted with phosphorus on TPW 324. BL0 322 is made of M1 metal layer and connected to the drain regions 314 and 320 through the ohmic contacts 321a and 321b.

Figure 11B:
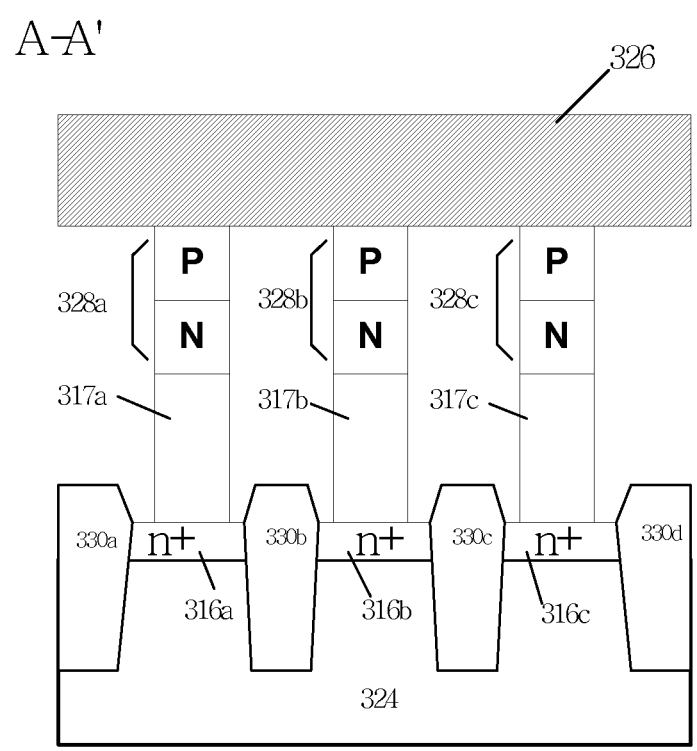
FIG. 11B is a cross sectional view of the modified 2T string NAND-based NOR flash cells of FIG. 11A taken along section A-A' thereof.

FIG. 11B is a cross sectional view of the modified 2T string NAND-based NOR flash cell in FIG. 11A taken at section A-A' thereof. There are three pillar-structured polysilicon diodes 328a, 328b and 328c formed and connected between polysilicon 326 and N+ source regions 316a, 316b and 316c through conductive layers 317a, 317b, and 317c on TPW 324. These diodes are isolated by the insulators 330a, 330b, 330c and 330d respectively.

Figure 12A:
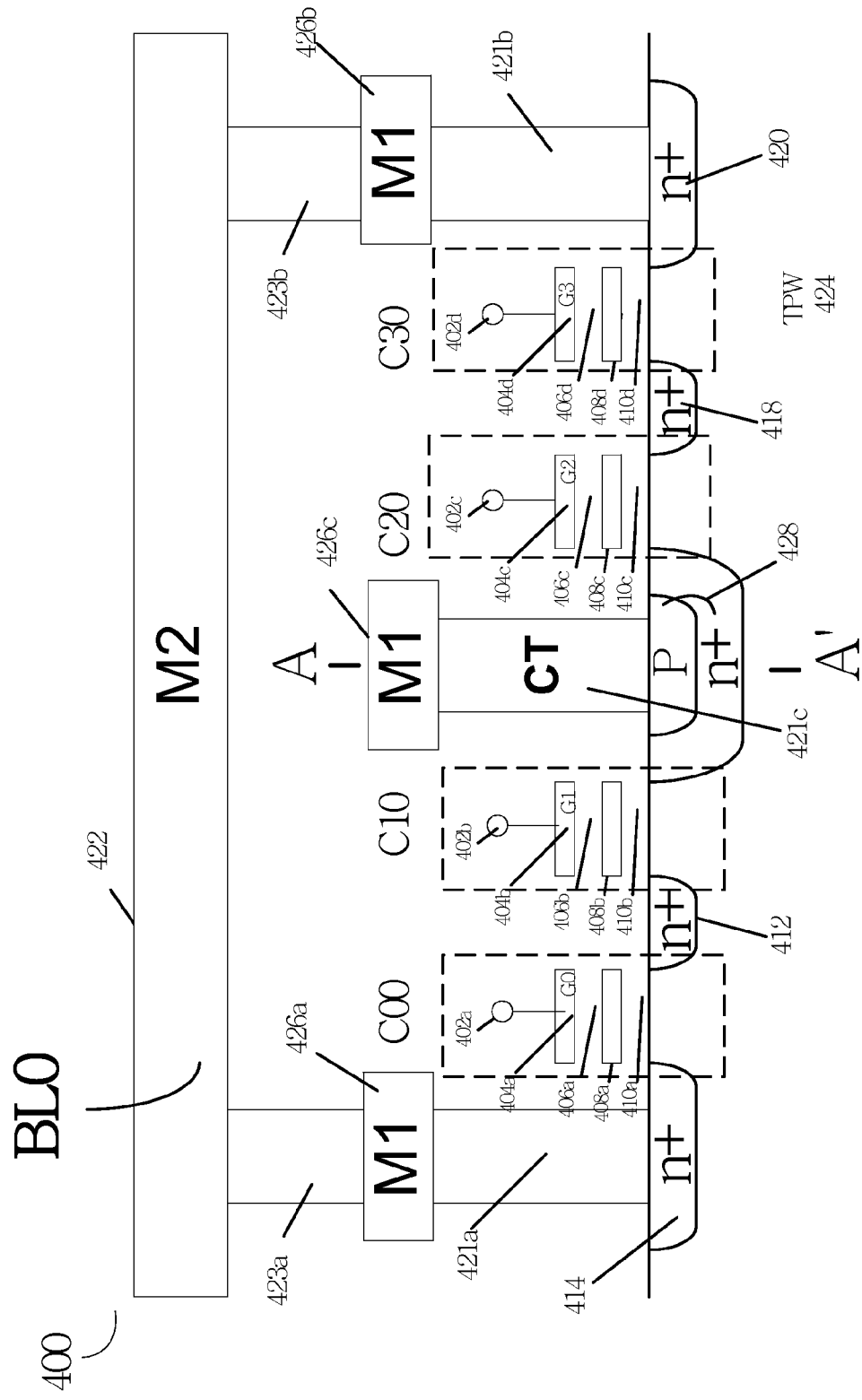
FIG. 12A is a cross sectional view of two pairs of the modified 2T string NAND-based NOR flash cells illustrated in FIG. 3B according to a further embodiment of the present invention.

FIG. 12A is a cross sectional view 400 of two pairs of modified 2T string NAND-based NOR flash cells 41 as shown in FIG. 3B according to another embodiment of the present invention. The gates of transistors C00, C10, C20 and C30 are made of poly2 conduction layer. G0 404a, G1 404b, G2 404c, and G3 404d are the poly2-gates of the 2-poly storage transistors C00, C10, C20 and C30. As described above, all seven nodes BL0 422, 402a, 402b, 402c, 402d, SL 426 and TPW 424 of the two pairs of modified 2T string NAND-based NOR flash cells have to be coupled with appropriate bias conditions in the circuit for respective operations.

Underneath the poly2-gates 404a, 404b, 404c and 404d, those NMOS device transistors have ONO as the gate dielectric shown as 406a, 406b, 406c and 406d, poly1 floating gates 408a, 408b, 408c and 408d and tunneling oxides 410a, 410b, 410c and 410d. The electrons injected from TPW 424 can be retained in the floating gates 408a, 408b, 408c and 408d while the flash cell is programmed. On the contrary, the stored electrons in the floating gates 408a, 408b, 408c and 408d are pulled out toward TPW 424 while an erase operation is performed. SL 426c is made of M1 metal layer and is connected to P/N+ junction diode 428 through the contact CT 421c. The heavily doped N+ drain regions 414, 420 and drain/source regions 412, 418 of the two pairs of modified 2T string NAND-based NOR flash cells are implanted with phosphorus on TPW 424. BL0 422 is made of M2 metal layer and connected to the drain regions 414 and 420 through the ohmic contacts 421a and 421b, M1 metal 426a, 426b, and vias 423a and 423b.

Figure 12B:
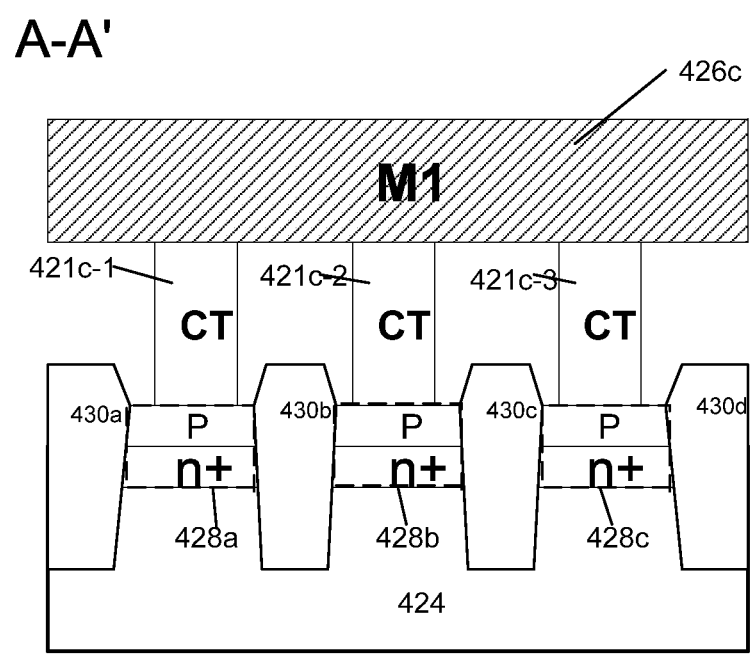
FIG. 12B is a cross sectional view of the modified 2T string NAND-based NOR flash cells of FIG. 12A taken along section A-A' thereof.

FIG. 12B is a cross sectional view of the modified 2T string NAND-based NOR flash cell in FIG. 12A taken at section A-A' thereof. There are three P/N+ junction diodes 428a, 428b and 428c. The negative ends of those three P/N+ junction diodes 428a, 428b and 428c are the source regions of the memory cells on TPW 424. The positive ends of those three P/N+ junction diodes 428a, 428b and 428c are connected to the common source line 426c by contacts 421c-1, 421c-2, and 421c-3. These diodes are isolated by the insulators 430a, 430b, 430c and 430d respectively.

Figure 13A:
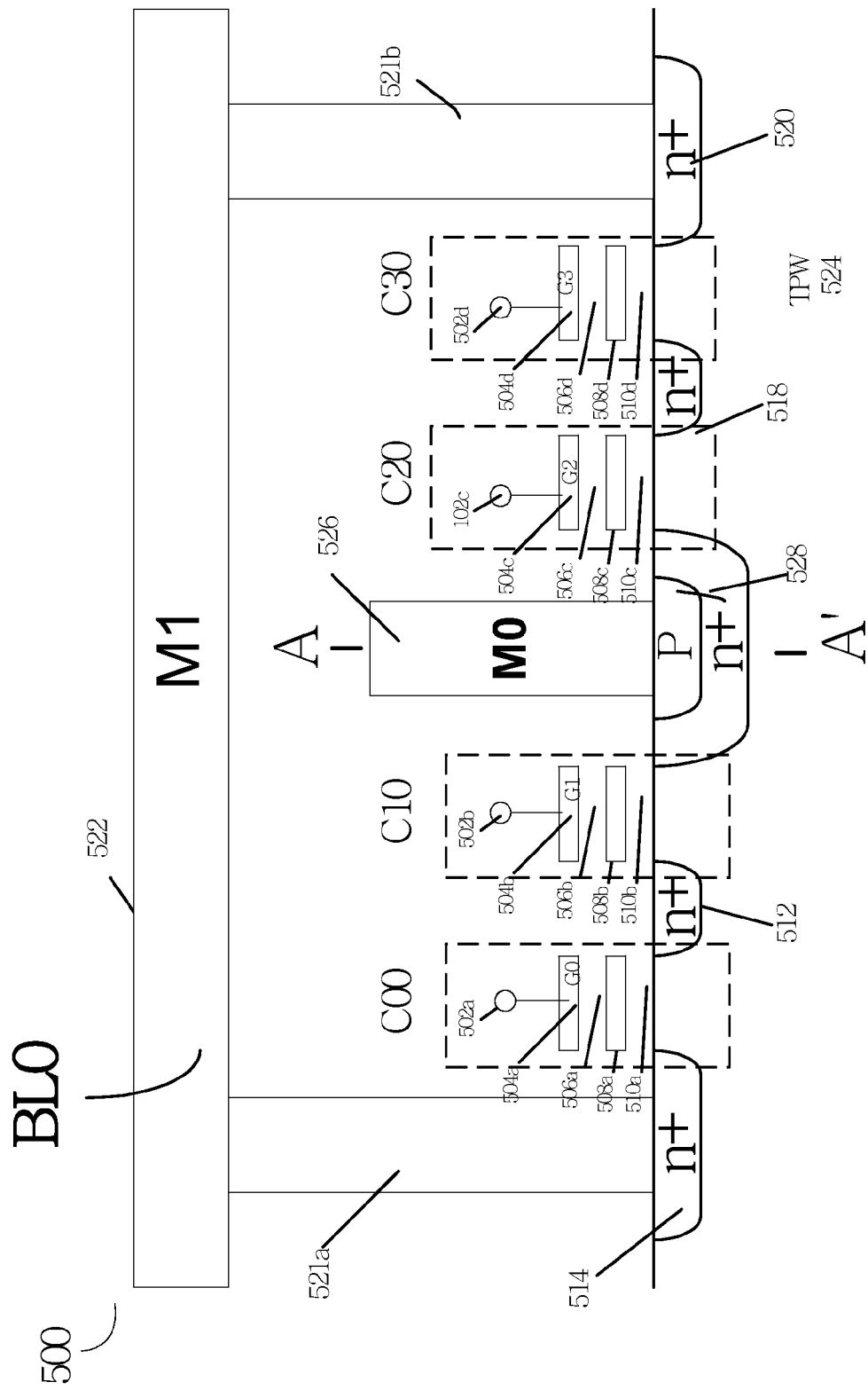
FIG. 13A is a cross sectional view of two pairs of the modified 2T string NAND-based NOR flash cells illustrated in FIG. 3B according to another embodiment of the present invention.

FIG. 13A is a cross sectional view 500 of two pairs of modified 2T string NAND-based NOR flash cells 41 as shown in FIG. 3B according to a further embodiment of the present invention. The gate of transistors C00, C10, C20 and C30 are made of poly2 conduction layer. G0 504a, G1 504b, G2 504c, and G3 504d are the poly2-gates of the 2-poly storage transistors C00, C10, C20 and C30. As described above, all seven nodes BL0 522, 502a, 502b, 502c, 502d, SL 526 and TPW 524 of the two pairs of modified 2T string NAND-based NOR flash have to be coupled with appropriate bias conditions in the circuit for respective operations.

Underneath the poly2-gates 504a, 504b, 504c and 504d, those NMOS device transistors have ONO as the gate dielectric shown as 506a, 506b, 506c and 506d, poly1 floating gates 508a, 508b, 508c and 508d and tunneling oxides 510a, 510b, 510c and 510d. The electrons injected from TPW 524 can be retained in the floating gates 508a, 508b, 508c and 508d while the flash cell is programmed. On the contrary, the stored electrons in the floating gates 508a, 508b, 508c and 508d are pulled out toward TPW 524 while an erase operation is performed. SL 526 is made of M0 metal layer and is directly connected to P/N+ junction diode 528. The heavily doped N+ drain regions 514, 520 and drain/source regions 512, 518 of the two pairs of modified 2T string NAND-based NOR flash cells are implanted with phosphorus on TPW 524. BL0 522 is made of M1 metal layer and connected to the drain regions 514 and 520 through the ohmic contacts 521a and 521b.

Figure 13B:
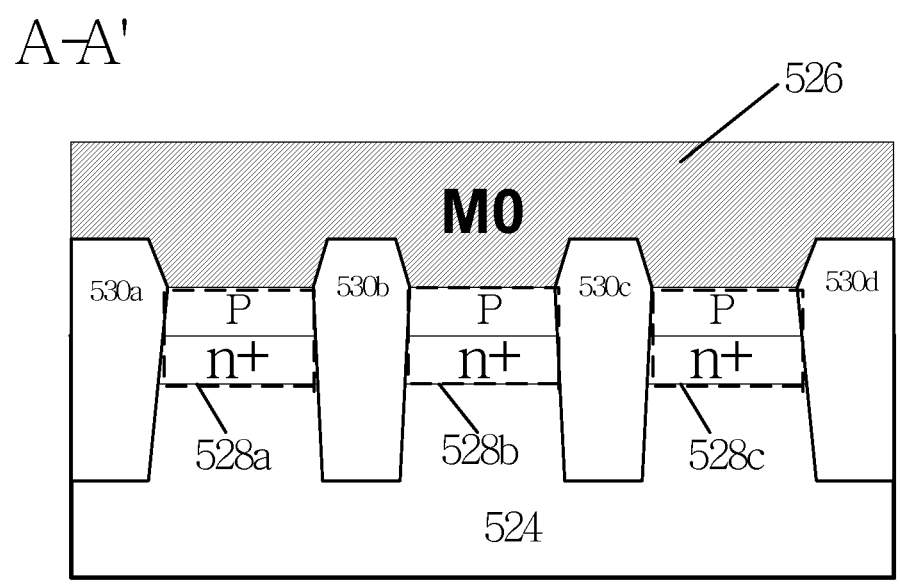
FIG. 13B is a cross sectional view of the modified 2T string NAND-based NOR flash cells of FIG. 13A taken along section A-A' thereof.

FIG. 13B is a cross sectional view of the modified 2T string NAND-based NOR flash cell in FIG. 13A taken at section A-A' thereof. There are three P/N+ junction diodes 528a, 528b and 528c. The negative ends of those three P/N+ junction diodes 528a, 528b and 528c are the source regions of the memory cells on TPW 524. The positive ends of those three P/N+ junction diodes 528a, 528b and 528c are connected directly to the common source line 526. These diodes are isolated by the insulators 530a, 530b, 530c and 530d respectively.

Figure 14:
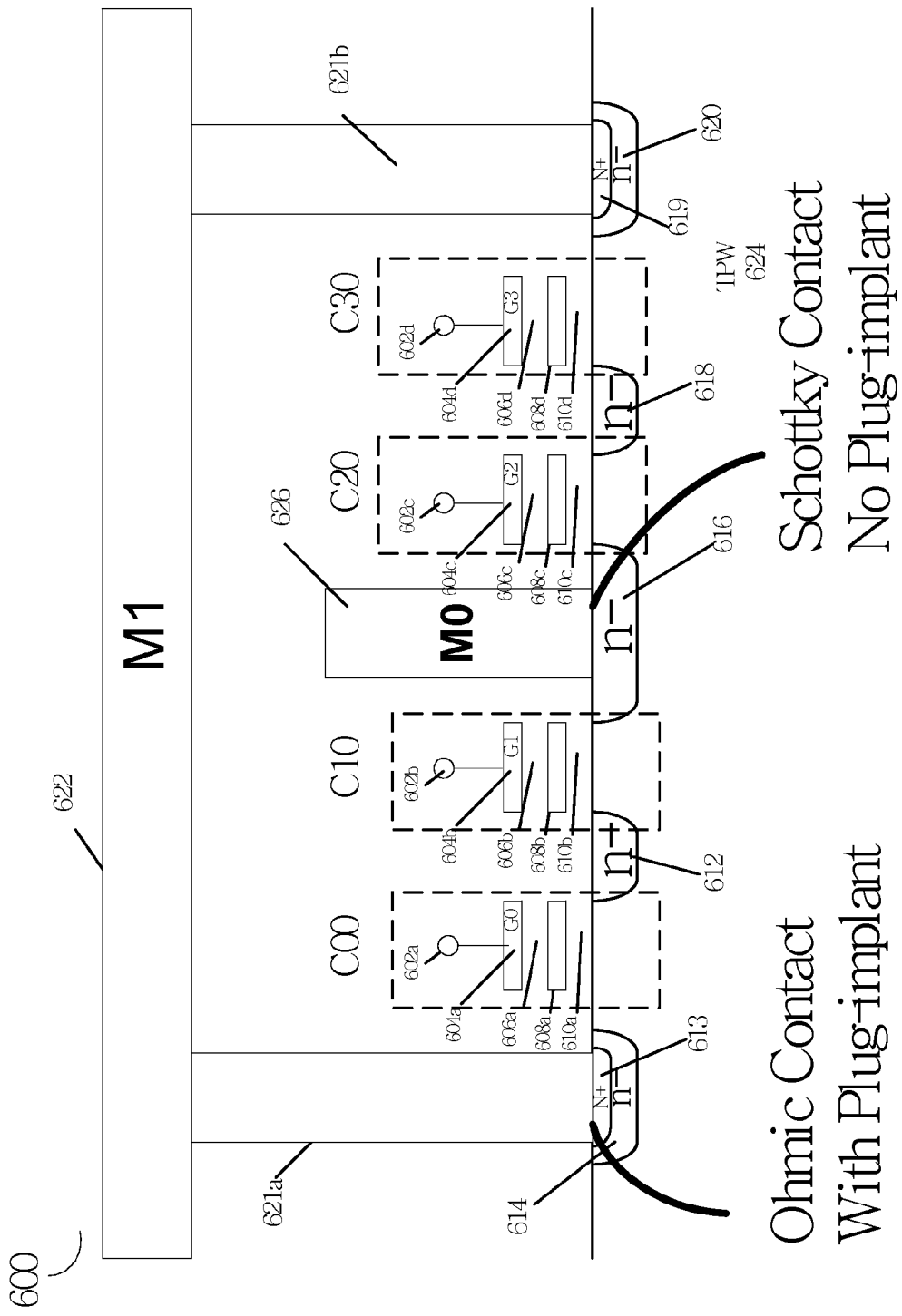
FIG. 14 is an example of forming Schottky diodes for two pairs of the modified 2T string NAND-based NOR flash cells in the embodiment shown in FIG. 7A by forming ohmic contact with plug implant at the drain region and Schottky contact without plug implant at the source region.

FIG. 14 is a cross sectional view 600 of two pairs of modified 2T string NAND-based NOR flash cells 41 as shown in FIG. 3B according to an example of the embodiment shown in FIG. 7A of the present invention. In this example, the Schottky contact of the Schottky barrier diode is formed without plug implant at the source region and the ohmic contact is formed with plug implant at the drain region. In the non-salicided contact process, the plug implant is used to reduce the contact resistance. Furthermore, the plug implant can prevent the contact etch from punching through the junction and causing a short to TPW.

According to the two pairs of modified 2T string NAND-based NOR flash cells 41 shown in FIG. 3B, the gates of transistors C00, C10, C20 and C30 are made of poly2 conduction layer in FIG. 14. G0 604a, G1 604b, G2 604c, and G3 604d are the poly2-gates of the 2-poly storage transistors C00, C10, C20 and C30. As described above, all seven nodes BL0 622, 602a, 602b, 602c, 602d, SL 626 and TPW 624 of the two pairs of modified 2T string NAND-based NOR flash cells have to be coupled with appropriate bias conditions in the circuit for respective operations.

Underneath the poly2-gates 604a, 604b, 604c and 604d, those NMOS device transistors have ONO as the gate dielectric shown as 606a, 606b, 606c and 606d, poly1 floating gates 608a, 608b, 608c and 608d and tunneling oxides 610a, 610b, 610c and 610d. The electrons injected from TPW 624 can be retained in the floating gates 608a, 608b, 608c and 608d while the flash cell is programmed. On the contrary, the stored electrons in the floating gates 608a, 608b, 608c and 608d are pulled out toward TPW 624 while an erase operation is performed. SL 626 is made of M0 metal layer and is directly connected to lightly doped N− region 616 to form the Schottky diode.

In order to form the Schottky diode at the source line, the lightly doped N− blanket implant is performed to all the active regions in the memory array first. Therefore, the N− drain regions 614, 620 and drain/source regions 612, 618 of the two pairs of modified 2T string NAND-based NOR flash cells are also lightly doped with phosphorus on TPW 624. Because a Schottky diode is not to be formed on the drain regions 614 and 620, the plug implant is highly doped to regions 613 and 619 as N+ junction regions enclosed by N− junction regions 614 and 620. BL0 622 is made of M1 metal layer and connected to the N+ drain regions 613 and 619 through the ohmic contacts 621a and 621b.

Figure 15:
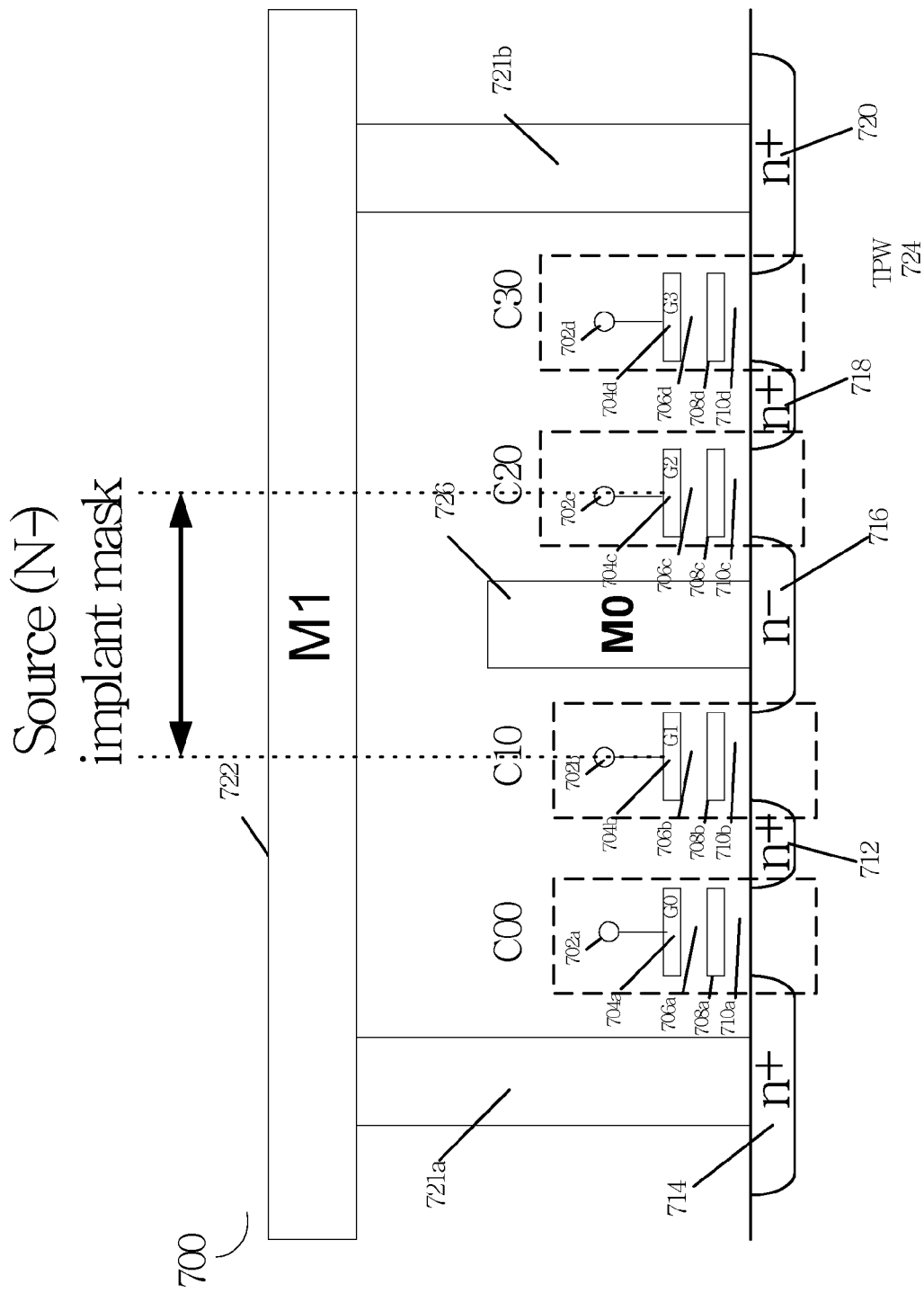
FIG. 15 is another example of forming Schottky for two pairs of the modified 2T string NAND-based NOR flash cells in the embodiment shown in FIG. 7A by using an implant mask to block the source region from the blanket N+ implant.

FIG. 15 is another example of forming Schottky diode in the two pairs of modified 2T string NAND-based NOR flash cells 41 of FIG. 3B according to the embodiment shown in FIG. 7A of the present invention. With reference to FIG. 15, the cross sectional view 700 shows one implant mask is used to block N+ implant at the source region. In the salicided contact process, plug implant is not required.

According to two pairs of modified 2T string NAND-based NOR flash cells 41 shown in FIG. 3B, the gates of transistors C00, C10, C20 and C30 are made of poly2 conduction layer in FIG. 15. G0 704a, G1 704b, G2 704c, and G3 704d are the poly2-gates of the 2-poly storage transistors C00, C10, C20 and C30. As described above, all seven nodes BL0 722, 702a, 702b, 702c, 702d, SL 726 and TPW 724 of the two pairs of modified 2T string NAND-based NOR flash cells have to be coupled with appropriate bias conditions in the circuit for respective operations.

Underneath the poly2-gates 704a, 704b, 704c and 704d, those NMOS device transistors have ONO as the gate dielectric shown as 706a, 706b, 706c and 706d, poly1 floating gates 708a, 708b, 708c and 708d and tunneling oxides 710a, 710b, 710c and 710d. The electrons injected from TPW 724 can be retained in the floating gates 708a, 708b, 708c and 708d while the flash cell is programmed. On the contrary, the stored electrons in the floating gates 708a, 708b, 708c and 708d are pulled out toward TPW 724 while an erase operation is performed. SL 726 is made of M0 metal layer and is directly connected to lightly doped N− region 716 to form the Schottky diode.

In order to form the Schottky diode, the heavily doped N+ blanket implant is performed to all the active regions in the array first except the active region along the source region 716 which is masked by the implant mask. Therefore, the N+ drain regions 714, 720 and drain/source regions 712, 718 of the two pairs of modified 2T string NAND-based NOR flash cells are also heavily doped with phosphorus on TPW 724. BL0 722 is made of M1 metal layer and connected to the N+ drain regions 714 and 720 through the ohmic contacts 721a and 721b. SL 726 is made of M0 metal layer and is directly connected to lightly doped N− region 716 to form the Schottky diode.

Although the above description has been using N-channel flash memory cells as examples, it is obvious that the principle of the invention is also applicable to P-channel flash memory cells. Similarly, a person of ordinary skill in the art can extend the erase, program and read operations, the diode connection from each source line to the source region, and the construction of the Schottky diode described above for the 2T string NAND-based NOR flash cells to a flash memory array which comprises a 1T NOR flash cell or an NT string NAND-based NOR flash cells. For simplicity, they will not be repeated in this description. Furthermore, the flash cell structure can also be extended to a traditional 2-dimensional flash cell structure or the 3-dimensional stacked flash cell structure.

It will be apparent to those skilled in the art that various modifications and variations can be made in the flash memory array by using a diode to connect the source node of each individual memory cell to one common source line according to the present invention. It is intended that the embodiments described above be considered as exemplary only, with a true scope of the disclosed embodiments being indicated by the following claims and their equivalents.

What is claimed is:

1. A flash memory array, comprising:
    a matrix of a plurality of flash cell units arranged in a plurality of rows and columns, each of said flash cell units having a drain node and every two adjacent flash cell units in a column having a common source node;
    a plurality of word lines, each word line associated with a row of said flash cell units;
    a plurality of bit lines laid out perpendicular to said word lines, each bit line associated with a column of said flash cell units and connected to the drains of the flash cell units in the associated column; and
    a plurality of source lines laid out in parallel with said word lines, each source line associated with two adjacent rows of said flash cell units having common source nodes and connected to each common source node in the associated rows respectively through a diode;
    wherein each flash cell unit is a two-transistor two-bit NAND-based NOR flash cell formed on a triple P-type well, and each row of said flash cell units is associated with two word lines.

2. The flash memory array according to claim 1, wherein each transistor of the flash cell unit comprises:
    a gate made of a poly2 conduction layer;
    an oxide-nitride-oxide layer underneath said gate;
    a floating gate underneath said oxide-nitride-oxide layer; and
    a tunneling oxide underneath said floating gate.

3. The flash memory array according to claim 1, wherein an erase operation for selected word lines of said flash memory array is based on a Fowler-Norheim tunneling scheme and accomplished by the following bias condition:
    applying a first voltage to said triple P-type well;
    applying a second voltage to each of said selected word lines, said first voltage having a voltage level approximately 20V greater than the voltage level of said second voltage;
    keeping each bit line as floating; and
    keeping each source line as floating.

4. The flash memory array according to claim 1, wherein a program operation in a selected word line of said flash memory array is based on a Fowler-Norheim tunneling scheme and accomplished by the following bias condition:
    applying a program voltage to the selected word line, said program voltage being a step-wise pulse voltage in a range from 15V to 20V;
    applying a pass voltage of approximately 10V to the other word line in the row associated with the selected word line;
    applying a bit-program voltage of 0V to bit lines selected for programming;
    applying a bit-inhibit voltage approximately in a range from 8V to 10V to bit lines selected but not to be programmed;
    applying an inhibit voltage having a voltage level approximately one half of said bit-inhibit voltage to unselected word lines;
    applying a voltage of 0V to the source line in the row associated with the selected word line; and
    applying a voltage of 0V to said triple P-type well.

5. The flash memory array according to claim 1, wherein a read operation in a selected word line of said flash memory array is accomplished by the following bias condition:
    applying a read voltage to the selected word line, said read voltage being approximately 1.5V to 2V greater than a highest threshold voltage of an erased flash cell unit of said flash memory array;
    applying a pass voltage to the other word line in the row associated with the selected word line, said pass voltage being approximately 2greater than a highest threshold voltage of a programmed flash cell unit of said flash memory array;
    applying a voltage of approximately 1.5V to the source line in the row associated with the selected word line;
    applying a voltage of 0V to unselected word lines; and
    applying a voltage of 0V to said triple P-type well.

6. The flash memory array according to claim 1, wherein each source line is made of a metal layer and directly in contact with each common source node which is lightly N− doped to form a respective Schottky barrier diode, and each bit line is made of another metal layer and connected through a respective ohmic contact to each drain node which is heavily N+doped.

7. The flash memory array according to claim 1, wherein each source line is made of a first metal layer and connected through a respective ohmic contact to each common source node which is lightly N− doped to form a respective Schottky barrier diode, and each bit line is made of a second metal layer and connected through a first via between said second metal layer and said first metal layer, said first metal layer, and a second via between said first metal layer and each drain node respectively to the drain node which is heavily N+ doped.

8. The flash memory array according to claim 1, wherein each source line is made of a metal layer and connected respectively through a pillar-structured polysilicon diode and a conduction layer to each common source node which is heavily N+ doped, and each bit line is made of another metal layer and connected through a respective ohmic contact to each drain node which is heavily N+doped.

9. The flash memory array according to claim 1, wherein each source line is made of a polysilicon layer and connected respectively through a pillar-structured polysilicon diode and a conduction layer to each common source node which is heavily N+ doped, and each bit line is made of a metal layer and connected through a respective ohmic contact to each drain node which is heavily N+ doped.

10. The flash memory array according to claim 1, wherein each source line is made of a first metal layer and connected through a respective ohmic contact to each common source node which is heavily N+ doped with a P/N+ junction diode enclosed therein, and each bit line is made of a second metal layer and connected through a first via between said second metal layer and said first metal layer, said first metal layer, and a second via between said first metal layer and each drain node respectively to the drain node which is heavily N+ doped.

11. The flash memory array according to claim 1, wherein each source line is made of a metal layer and directly in contact with each common source node which is heavily N+ doped with a P/N+ junction diode enclosed therein, and each bit line is made of another metal layer and connected through a respective ohmic contact to each drain node which is heavily N+ doped.

12. The flash memory array according to claim 1, wherein each source line is made of a metal layer and directly in contact with each common source node which is lightly N− doped to form a respective Schottky barrier diode, and each bit line is made of another metal layer and connected through a respective ohmic contact to each drain node which is lightly N−doped with a heavily doped N+ junction region enclosed therein.

13. A flash memory array, comprising:
a matrix of a plurality of flash cell units arranged in a plurality of rows and columns, each of said flash cell units having a drain node and every two adjacent flash cell units in a column having a common source node;
a plurality of word lines, each word line associated with a row of said flash cell units;
a plurality of bit lines laid out perpendicular to said word lines, each bit line associated with a column of said flash cell units and connected to the drains of the flash cell units in the associated column; and
a plurality of source lines laid out in parallel with said word lines, each source line associated with two adjacent rows of said flash cell units having common source nodes and connected to each common source node in the associated rows respectively through a diode;
wherein each flash cell unit is an N transistor NAND-based NOR flash cell formed on a triple P-type well with N being greater than 2, and each row of said flash cell units is associated with N of said word lines.

14. The flash memory array according to claim 13, wherein each transistor of the flash cell unit comprises:
a gate made of a poly2 conduction layer;
an oxide-nitride-oxide layer underneath said gate;
a floating gate underneath said oxide-nitride-oxide layer; and
a tunneling oxide underneath said floating gate.

15. The flash memory array according to claim 13, wherein an erase operation for selected word lines of said flash memory array is based on a Fowler-Norheim tunneling scheme and accomplished by the following bias condition:
applying a first voltage to said triple P-type well;
applying a second voltage to each of said selected word lines, said first voltage having a voltage level approximately 20V greater than the voltage level of said second voltage;
keeping each bit line as floating; and
keeping each source line as floating.

16. The flash memory array according to claim 13, wherein a program operation in a selected word line of said flash memory array is based on a Fowler-Norheim tunneling scheme and accomplished by the following bias condition:
applying a program voltage to the selected word line, said program voltage being a step-wise pulse voltage in a range from 15V to 20V;
applying a pass voltage of approximately 10V to the other word lines in the row associated with the selected word line;
applying a bit-program voltage of 0V to bit lines selected for programming;
applying a bit-inhibit voltage approximately in a range from 8V to 10V to bit lines selected but not to be programmed;
applying an inhibit voltage having a voltage level approximately one half of said bit-inhibit voltage to unselected word lines;

applying a voltage of 0V to the source line in the row associated with the selected word line; and
applying a voltage of 0V to said triple P-type well.

17. The flash memory array according to claim 13, wherein a read operation in a selected word line of said flash memory array is accomplished by the following bias condition:
applying a read voltage to the selected word line, said read voltage being approximately 1.5V to 2V greater than a highest threshold voltage of an erased flash cell unit of said flash memory array;
applying a pass voltage to the other word lines in the row associated with the selected word line, said pass voltage being approximately 2V greater than a highest threshold voltage of a programmed flash cell unit of said flash memory array;
applying a voltage of approximately 1.5V to the source line in the row associated with the selected word line;
applying a voltage of 0V to unselected word lines; and
applying a voltage of 0V to said triple P-type well.

18. The flash memory array according to claim 13, wherein each source line is made of a metal layer and directly in contact with each common source node which is lightly N− doped to form a respective Schottky barrier diode, and each bit line is made of another metal layer and connected through a respective ohmic contact to each drain node which is heavily N+ doped.

19. The flash memory array according to claim 13, wherein each source line is made of a first metal layer and connected through a respective ohmic contact to each common source node which is lightly N− doped to form a respective Schottky barrier diode, and each bit line is made of a second metal layer and connected through a first via between said second metal layer and said first metal layer, said first metal layer, and a second via between said first metal layer and each drain node respectively to the drain node which is heavily N+ doped.

20. The flash memory array according to claim 13, wherein each source line is made of a metal layer and connected respectively through a pillar-structured polysilicon diode and a conduction layer to each common source node which is heavily N+ doped, and each bit line is made of another metal layer and connected through a respective ohmic contact to each drain node which is heavily N+ doped.

21. The flash memory array according to claim 13, wherein each source line is made of a polysilicon layer and connected respectively through a pillar-structured polysilicon diode and a conduction layer to each common source node which is heavily N+ doped, and each bit line is made of a metal layer and connected through a respective ohmic contact to each drain node which is heavily N+ doped.

22. The flash memory array according to claim 13, wherein each source line is made of a first metal layer and connected through a respective ohmic contact to each common source node which is heavily N+ doped with a P/N+ junction diode enclosed therein, and each bit line is made of a second metal layer and connected through a first via between said second metal layer and said first metal layer, said first metal layer, and a second via between said first metal layer and each drain node respectively to the drain node which is heavily N+ doped.

23. The flash memory array according to claim 13, wherein each source line is made of a metal layer and directly in contact with each common source node which is heavily N+ doped with a P/N+ junction diode enclosed therein, and each bit line is made of another metal layer and connected through a respective ohmic contact to each drain node which is heavily N+ doped.

24. The flash memory array according to claim 13, wherein each source line is made of a metal layer and directly in contact with each common source node which is lightly N− doped to form a respective Schottky barrier diode, and each bit line is made of another metal layer and connected through a respective ohmic contact to each drain node which is lightly N− doped with a heavily doped N+ junction region enclosed therein.

* * * * *